(12) United States Patent
Englekirk

(10) Patent No.: US 9,793,795 B2
(45) Date of Patent: Oct. 17, 2017

(54) VARIABLE FREQUENCY CHARGE PUMP

(71) Applicant: Peregrine Semiconductor Corporation, San Diego, CA (US)

(72) Inventor: Robert Mark Englekirk, Littleton, CO (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/382,483

(22) Filed: Dec. 16, 2016

(65) Prior Publication Data

US 2017/0098996 A1 Apr. 6, 2017

Related U.S. Application Data

(63) Continuation of application No. 14/991,577, filed on Jan. 8, 2016, now Pat. No. 9,685,963, which is a continuation of application No. 13/933,006, filed on Jul. 1, 2013, now Pat. No. 9,264,053.

(51) Int. Cl.
*H02M 3/07* (2006.01)
*H02M 1/00* (2006.01)

(52) U.S. Cl.
CPC .... *H02M 3/073* (2013.01); *H02M 2001/0045* (2013.01); *H02M 2003/071* (2013.01)

(58) Field of Classification Search
None
See application file for complete search history.

(56) References Cited

U.S. PATENT DOCUMENTS

| | | | |
|---|---|---|---|
| 4,797,899 A | 1/1989 | Fuller et al. | |
| 5,227,675 A * | 7/1993 | Taguchi | H02M 3/07 327/530 |
| 5,483,434 A * | 1/1996 | Seesink | G11C 5/145 307/110 |
| 5,546,031 A * | 8/1996 | Seesink | H02M 3/07 327/155 |
| 5,734,291 A | 3/1998 | Tasdighi et al. | |
| 5,774,404 A | 6/1998 | Eto | |

(Continued)

OTHER PUBLICATIONS

Hiltunen, Thomas J., Office Action received from the USPTO dated Apr. 14, 2016 for U.S. Appl. No. 14/991,577, 13 pgs.

(Continued)

*Primary Examiner* — Thomas J Hiltunen
(74) *Attorney, Agent, or Firm* — Jaquez Land Greenhaus LLP; Martin J. Jaquez, Esq.; John Land, Esq.

(57) ABSTRACT

A charge pump circuit that utilizes a sensing circuit for determining the current loading or status of the output supply generated by the charge pump circuit to determine a corresponding frequency for a variable rate clock for the charge pump circuit. When a current load is present, the clock frequency automatically ramps up to a relatively high level to increase the output current of the charge pump circuit. When the current load is removed and the supply is settled out, the clock frequency is automatically reduced to a relatively quieter level and the charge pump circuitry operates at a lower power level. Accordingly, the charge pump circuit is only noisy when it has to be, thus providing optimal power when required and being electrically quiet and operating at lower power at all other times.

8 Claims, 2 Drawing Sheets

(56) References Cited

U.S. PATENT DOCUMENTS

| | | | |
|---|---|---|---|
| 5,818,766 A * | 10/1998 | Song | G11C 16/30 327/536 |
| 6,223,990 B1 | 5/2001 | Kamei | |
| 6,275,096 B1 | 8/2001 | Hsu et al. | |
| 6,400,211 B1 * | 6/2002 | Yokomizo | H02M 3/07 327/536 |
| 6,560,164 B2 | 5/2003 | Kawai et al. | |
| 6,617,933 B2 | 9/2003 | Ito et al. | |
| 6,661,683 B2 | 12/2003 | Botker et al. | |
| 6,664,861 B2 | 12/2003 | Murakami | |
| 6,809,603 B1 | 10/2004 | Ho | |
| 6,812,775 B2 | 11/2004 | Seo | |
| 7,068,114 B2 | 6/2006 | Nishiyama | |
| 7,126,595 B2 | 10/2006 | Yanagi et al. | |
| 7,180,794 B2 | 2/2007 | Matsue | |
| 7,532,061 B2 | 5/2009 | Ragone et al. | |
| 7,545,684 B2 * | 6/2009 | Nakagawa | G11C 16/12 365/185.19 |
| 7,667,529 B2 | 2/2010 | Consuelo et al. | |
| 7,724,072 B2 | 5/2010 | Baek et al. | |
| 7,928,796 B2 * | 4/2011 | Namekawa | H02M 3/073 327/114 |
| 7,944,277 B1 * | 5/2011 | Sinitsky | G05F 1/56 327/536 |
| 7,956,675 B2 | 6/2011 | Saitoh et al. | |
| 8,519,780 B1 * | 8/2013 | Vilas Boas | H02M 3/07 327/536 |
| 8,629,935 B2 * | 1/2014 | Kikuchi | H04N 5/23241 348/241 |
| 8,816,659 B2 | 8/2014 | Kim et al. | |
| 8,995,154 B2 | 3/2015 | Kaneda | |
| 9,154,027 B2 * | 10/2015 | Huynh | H02M 3/07 |
| 9,264,053 B2 * | 2/2016 | Englekirk | H03L 7/0891 |
| 9,584,133 B2 * | 2/2017 | Kratyuk | G05F 3/242 |
| 9,660,590 B2 | 5/2017 | Kim et al. | |
| 9,685,963 B2 | 6/2017 | Englekirk | |
| 2006/0114731 A1 | 6/2006 | Park et al. | |
| 2010/0110736 A1 | 5/2010 | Gronthal et al. | |
| 2010/0245327 A1 | 9/2010 | Tsujino et al. | |
| 2011/0156819 A1 | 6/2011 | Kim et al. | |
| 2013/0148456 A1 | 6/2013 | Cho et al. | |
| 2013/0320955 A1 | 12/2013 | Kratyuk et al. | |

OTHER PUBLICATIONS

Hiltunen, Thomas J., Final Office Action received from the USPTO dated Aug. 1, 2016 for U.S. Appl. No. 14/991,577, 17 pgs.

Hiltunen, Thomas J., Notice of Allowance received from the USPTO dated Nov. 18, 2016 for U.S. Appl. No. 14/991,577, 11 pgs.

Hiltunen, Thomas J., Notice of Allowance received from the USPTO dated Mar. 22, 2017 for U.S. Appl. No. 14/991,577, 9 pgs.

Hiltunen, Thomas J., Notice of Allowance received from the USPTO dated May 10, 2017 for U.S. Appl. No. 14/991,577, 10 pgs.

Englekirk, Robert Mark, Preliminary Amendment filed in the USPTO dated Feb. 12, 2016 for U.S. Appl. No. 14/991,577, 13 pgs.

Englekirk, Robert Mark, Amendment filed in the USPTO dated Jun. 10, 2016 for U.S. Appl. No. 14/991,577, 13 pgs.

Englekirk, Robert Mark, Response After Final Office Action filed in the USPTO dated Oct. 31, 2016 for U.S. Appl. No. 14/991,577, 14 pgs.

Wells, Kenneth B., Office Action received from the USPTO dated Jan. 5, 2017 for U.S. Appl. No. 14/883,525, 18 pgs.

Nguyen, Hieu P. Notice of Allowance received from the USPTO dated Jan. 12, 2017 for U.S. Appl. No. 14/638,954, 14 pgs.

Mehari, Yemane, Office Action received from the USPTO dated Mar. 22, 2017 for U.S. Appl. No. 15/059,206, 35 pgs.

Kim, et al., Response filed in the USPTO dated Mar. 29, 2017 for U.S. Appl. No. 15/059,206, 4 pgs.

Englekirk, Robert Mark, Response filed in the USPTO dated Mar. 30, 2017 for U.S. Appl. No. 15/179,416, 16 pgs.

Wells, Kenneth B., Office Action received from the USPTO dated Apr. 17, 2017 for U.S. Appl. No. 14/883,525, 13 pgs.

Skibinski, Thomas S., Notice of Allowance received from the USPTO dated Apr. 24, 2017 for U.S. Appl. No. 15/179,416, 15 pgs.

Skibinski, Thomas S., Notice of Allowance received from the USPTO dated Jun. 22, 2017 for U.S. Appl. No. 15/179,416, 14 pgs.

Mehari, Yemane, Notice of Allowance received from the USPTO dated Jul. 3, 2017 for U.S. Appl. No. 15/059,206, 25 pgs.

Burgener, et al., Response filed in the USPTO dated Aug. 31, 2017 for U.S. Appl. No. 14/883,525, 9 pgs.

\* cited by examiner

VARIABLE FREQUENCY CHARGE PUMP

CROSS-REFERENCE TO RELATED APPLICATIONS

The present application is a continuation of commonly owned U.S. patent application Ser. No. 14/991,577 entitled "Variable Frequency Charge Pump" filed on Jan. 8, 2016, which Ser. No. 14/991,577 is incorporated by reference herein in its entirety. Application Ser. No. 14/991,577 is a continuation of commonly owned U.S. patent application Ser. No. 13/933,006 entitled "Variable Frequency Charge Pump" filed on Jul. 1, 2013, now U.S. Pat. No. 9,264,053, issued Feb. 16, 2016, which Ser. No. 13/933,006 application is incorporated by reference herein in its entirety. Application Ser. No. 13/933,006 is related to the following commonly assigned issued patents and pending applications: U.S. Pat. No. 7,719,343 issued May 18, 2010 entitled "Low Noise Charge Pump Method and Apparatus"; identically entitled U.S. Pat. No. 8,378,736 issued Feb. 19, 2013; U.S. Pat. No. 8,994,452 issued Mar. 31, 2015, entitled "Low-Noise High Efficiency Bias Generation Circuits and Method"; U.S. Pat. No. 8,373,490 issued Feb. 12, 2013 entitled "Method, System and Apparatus for RF and DC Switching"; U.S. Pat. No. 8,686,787 issued on Apr. 1, 2014, entitled "High Voltage Ring Pump with Inverter Stages and Voltage Boosting Stages"; U.S. Pat. No. 8,816,659 issued Aug. 26, 2014, entitled "Low-Noise High Efficiency Bias Generation Circuits and Method".

BACKGROUND (1) Technical Field

This invention generally relates to electronic power supplies, and more specifically to capacitive energy transfer DC-to-DC converters (DC/DC converters), such as charge pumps.

(2) Background

DC/DC converter power supply circuits provide a DC output voltage based upon a DC source voltage, where the output voltage is typically different than the input voltage. As the term is used herein, DC/DC converters do not encompass voltage reduction regulator circuits that use a linear pass device, but rather involve energy transfer from input to output through an energy storage device, such as a capacitor or an inductor.

A type of DC/DC converter is a "charge pump", which obtains energy for the output voltage primarily by means of capacitive transfer from the source to the output. An inductor is not generally the primary energy transfer device in a charge pump, though of course hybrid devices are possible that employ inductive energy transfer in addition to capacitive energy transfer. A charge pump may derive an output voltage that is higher than a source voltage, or that is inverted from a source voltage, or that is referenced to a different voltage than the source voltage, and may do all of these things concurrently. Energy transfer capacitors used in charge pumps are typically known as "fly capacitors" or "fly caps".

Charge pumps may be implemented for a wide variety of purposes. They are well suited for integrated circuit fabrication because the devices and elements required are compatible with most integrated circuit fabrication techniques. For example, a charge pump may be employed to generate a negative gate bias supply for an integrated circuit that switches an antenna between send and receive circuitry of a transceiver, as shown in FIG. 1. Many wireless transceivers, such as cellular telephones, employ a single antenna for both receiving and transmitting. While such systems are receiving, an antenna 102 must be coupled to receive circuitry 103 that may include, for example, a filter 104 and a low noise amplifier 106, to provide the received signal for further processing. However, while such systems are transmitting, the antenna 102 must be disconnected from the sensitive receive circuitry 103 and coupled instead to relatively high power transmit circuitry 107. The transmit circuitry 107 may further include, for example, a power amplifier 108 and a transmit filter 110 to process a transmit signal. Note that the circuit shown in FIG. 1 is schematically simple for ease of understanding; in an actual implementation, there are often multiple transmit and receive circuits, and transmission and reception may be occurring on the same path at the same time.

An RF switch 112 may be used to perform such antenna switching functions, as well as RF switching functions in general. Ideally, such switches may be integrated together with the receive and/or transmit circuitry, and in any event are desirably very small, due to integrated circuit die cost and space limitations in portable transceivers such as mobile telephones and handy talkies. In order to achieve good performance from switching devices, such as FETs, used to implement such RF switches, many designs need a special bias supply that extends negatively below the supply rails of the transmit and receive circuitry, such as a −3V supply. In view of the space and cost constraints of transceiver units such as mobile telephones, a charge pump is particularly suitable for generating such a bias supply, because it can be readily integrated into a very small circuit.

The RF switch 112 conveys relatively high power signals to the antenna 102 during transmission. However, during receive, the signal passed by the RF switch 112 may be measured in tens of nanovolts. Sharp noise transitions may have an extremely broad frequency content, and thus even signals at amplitudes on the order of millivolts may interfere unacceptably with reception if the signals have extremely fast edges. While the filter 104 can remove some noise, it is important that the RF switch 112 not introduce noise, particularly noise having components near the center frequency of the received signal. Thus, the receive/transmit switch of FIG. 1 illustrates one of many circumstances in which a charge pump may be desired for a circuit that nonetheless requires extremely low noise.

Unfortunately, noise generation is one of the most common drawbacks of charge pumps. Current spikes are typically coupled into both input and output supplies, together with voltage ripples and spikes. When a charge pump is integrated together with other devices, such electronic noise may be coupled throughout the circuitry of the integrated device by a variety of mechanisms that are difficult to control.

Charge pump power supplies can also be weak (i.e., not able to drive large load currents), although a designer may trade drive strength for noise. In some applications (generally FET based designs), loading events primarily occur during state or mode changes for the part. During this time, the noise generated by the charge pump circuitry is not a critical factor. As such, a designer may desire some way to switch between a mode that is strong, and one that is quiet. Charge pumps typically require the use of some form of clock, whether externally provided or internally generated. A higher clock rate will make for a stronger charge pump, but this may also introduce more noise. Also, higher frequency noise terms may tend to couple more easily into undesired places or bands. In particular, the frequency of the charge pump clock can show up as a distinct "spur" signals (spurs) both at multiples of itself in baseband and/or at multiples of itself offset from whatever RF frequency is being utilized by the system. In the case of a switch with both transmit and receive signals present in different bands, it is possible for clock spurs offset from the transmit band to show up in the receive band.

It is known to use two clock frequencies, high and low, in a charge pump circuit to switch between a strong, noisy mode and a weak, less noisy mode. However, in such designs, the clock frequency is only high for a fixed period of time starting at the beginning of a state change. Due to process variation and unknown loading conditions, this two-state clock may either turn off too soon, resulting in poor settling time, or too late, resulting in noise being present during a desired "quiet" period.

Thus, a need exists for charge pumps that avoid generating excessive noise, so as to reduce charge pump noise injection into source supplies, output supplies, and related circuits.

The method and apparatus presented below address this need for a low-noise charge pump. Various aspects of the method and apparatus described below will be seen to provide further advantages, as well, for the design and construction of charge pumps that are relatively free of noise spurs.

SUMMARY OF THE INVENTION

A charge pump method and apparatus for DC-to-DC conversion is set forth by which an output is generated in a charge pump circuit by alternately coupling a transfer capacitor to an input supply and then to the output. A variable rate charge pump clock output is generated to control the charge pump circuit. The charge pump method and apparatus further includes a combination of one or more aspects of the method and apparatus, as set forth below, in order to reduce noise or otherwise improve the design.

More particularly, the invention includes a charge pump circuit that utilizes a sensing circuit for determining the current loading or status of the output supply generated by the charge pump circuit to determine a corresponding frequency for a variable rate clock for the charge pump circuit. When a load is present, the clock frequency automatically ramps up to a relatively high level to increase the output current of the charge pump circuit. When the load is removed and the supply is settled out, the clock frequency is automatically reduced to a relatively quieter level. Accordingly, the charge pump circuit is only noisy when it has to be, thus providing optimal power when required and being electrically quiet at all other times.

A further aspect of the invention is to add some randomization to the clock signal to the charge pump(s) in order to spread generated output spurs. An optional noise source may be added to the bias signal to a clock source for a charge pump to add some variability to the clock signal.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

A charge pump method and apparatus for DC-to-DC conversion is set forth by which an output is generated in a charge pump circuit by alternately coupling a transfer capacitor to an input supply and then to the output. A variable rate charge pump clock output is generated to control the charge pump circuit. The charge pump method and apparatus further includes a combination of one or more aspects of the method and apparatus, as set forth below, in order to reduce noise, reduce supply current, or otherwise improve the design.

More particularly, the invention includes a charge pump circuit that utilizes a sensing circuit for determining the current loading or status of the output supply generated by the charge pump circuit to determine a corresponding frequency for a variable rate clock for the charge pump circuit. When a load is present (typically during state changes), the clock frequency automatically ramps up to a relatively high level to increase the output current of the charge pump circuit. When the load is removed and the supply is settled out, the clock frequency is automatically reduced to a relatively quieter level. Accordingly, the charge pump circuit is only noisy when it has to be, thus providing optimal power when required and being electrically quiet at all other times. In addition, when the clock frequency is at a reduced level, the charge pump circuitry operates at a lower power level, which is particularly useful for battery powered systems.

Figure 1:
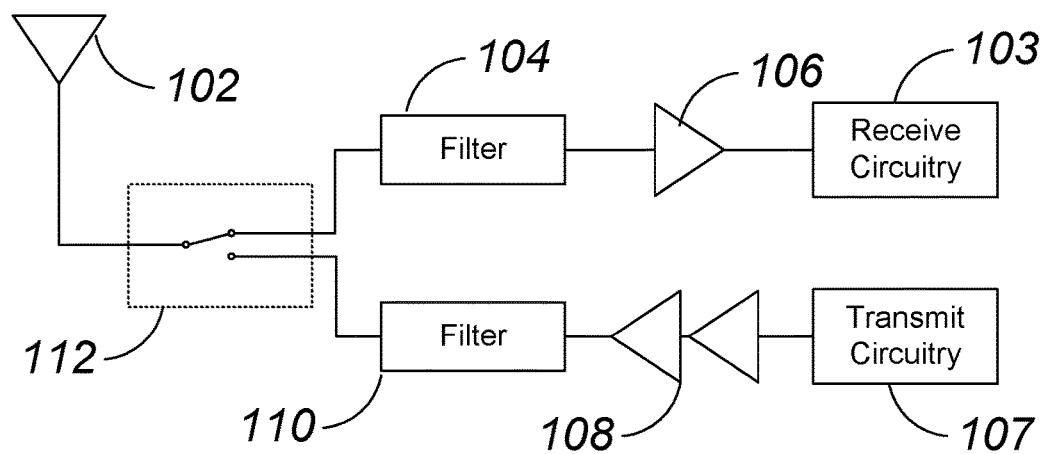
FIG. 1 is a circuit diagram of a prior art integrated circuit that switches an antenna between send and receive circuitry of a transceiver.
Figure 2:
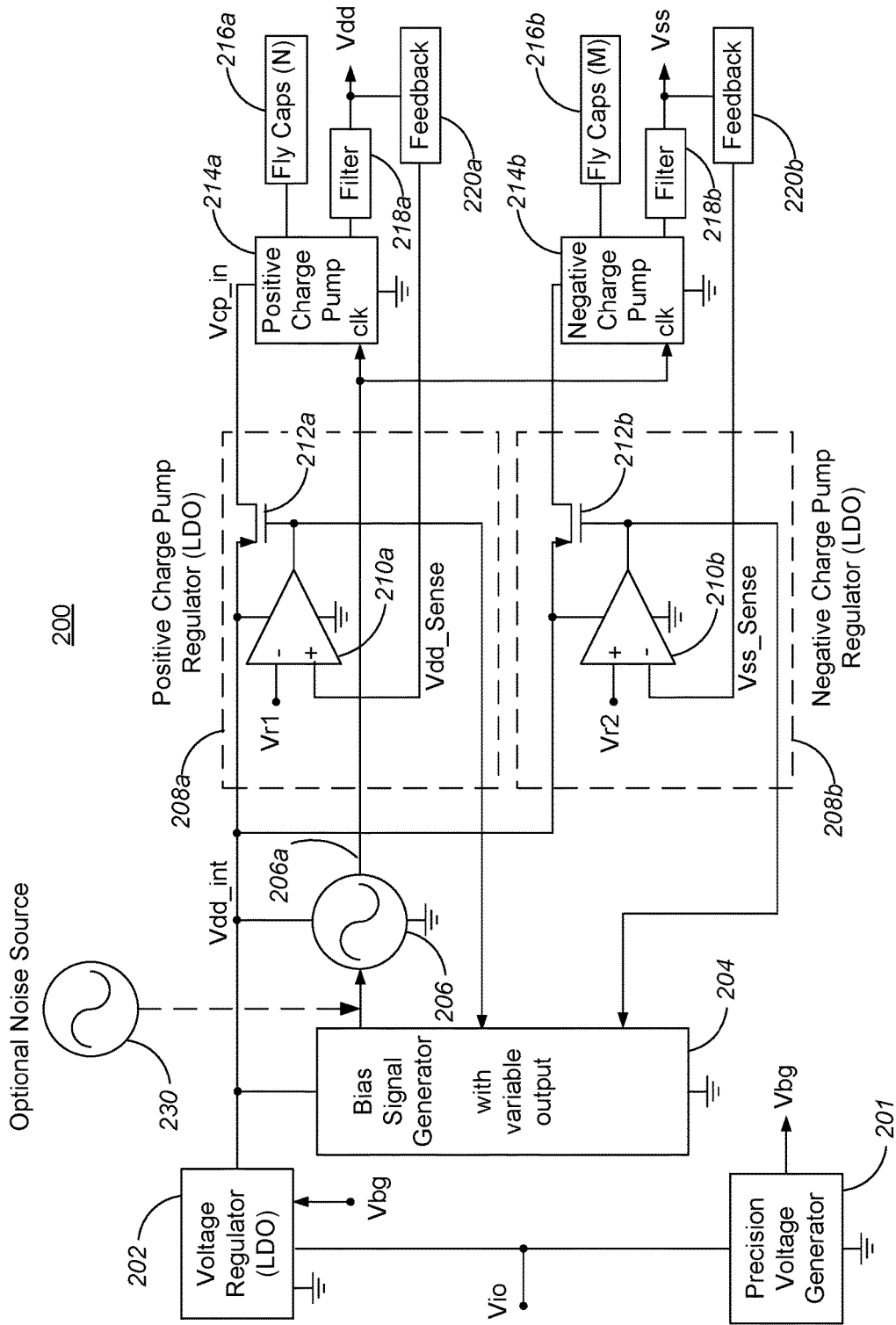
FIG. 2 is a circuit diagram of one embodiment of a variable frequency charge pump in accordance with the invention.

FIG. 2 is a circuit diagram of one embodiment 200 of a variable frequency charge pump in accordance with the invention. A precision voltage generator 201 provides a DC reference voltage Vbg from an input DC voltage Vio which may vary over some range. In the illustrated embodiment, Vio may range, for example, from 1.6V to 3.6V. While a number of circuits may be used to implement the precision voltage generator 201, one circuit that may be used is a bandgap voltage reference circuit. A bandgap voltage reference circuit is a temperature independent voltage reference circuit widely used in integrated circuits.

In the illustrated embodiment, a voltage regulator 202 clamps the input voltage Vio to a stable steady DC voltage Vdd_int. The voltage regulator 202 may be implemented as a low-dropout (LDO) regulator, a version of which is described in greater detail below. The reference voltage Vbg may be used to provide a suitable reference voltage for the voltage regulator 202 and other parts of the circuit as needed.

In the illustrated embodiment, the output voltage Vdd_int from the voltage regulator 202 is coupled to a bias signal generator 204, a clock source 206, and both a positive charge pump regulator 208a and a negative charge pump regulator 208b. The bias signal generator 204 provides a variable output bias signal in response to one or more inputs (e.g., a current input or a voltage input), and may be implemented in any number of known ways. The output bias signal from the bias signal generator 204 determines the output frequency of the clock source 206. The clock source 206 may be, for example, a voltage or current controlled oscillator.

A positive charge pump regulator 208a is shown implemented as a low-dropout (LDO) regulator, which is a DC linear voltage regulator which can operate with a very small input-output differential voltage. The advantages of an LDO voltage regulator include a low minimum operating voltage, high efficiency operation, and low heat dissipation. The main components of the LDO are a differential amplifier (error amplifier) 210a and a power FET 212a.

The output of the differential amplifier 210a controls (gates) the conductivity of the power FET 212a, thus regulating the voltage level applied to the input of a positive charge pump 214a. One input of the differential amplifier 210a is a precision reference voltage Vr1 (which may be, for example, Vbg). The other input (Vdd_Sense) of the differential amplifier 210a is a fraction of the output voltage (Vdd) of the positive charge pump 214a, where Vdd_Sense is determined by a feedback circuit 220a. As one example, the feedback circuit 220 may be implemented as a resistive divider coupled between ground and Vdd, such that if the output voltage Vdd rises, Vdd_Sense will rise proportionately. If Vdd_Sense deviates too high or too low relative to the reference voltage Vr1, the output of the differential amplifier 210a causes the conductivity of power FET 212a to change to maintain a proper voltage input to the positive charge pump 214a such that the voltage output Vdd of the positive charge pump 214a is constant.

The positive charge pump 214a may be implemented in a number of known ways. A suitable charge pump circuit is taught in U.S. patent Ser. No. 07/719,343, issued May 18, 2010 and assigned to the assignee of the present invention. A charge pump typically has an input voltage supply (e.g., Vcp_in), a voltage supply output (e.g., Vdd), and some form of clock signal input (discussed below). In general, charge pump based DC-to-DC conversion is accomplished by alternately coupling a transfer or "fly" capacitor to the input voltage supply and then to the voltage supply output. The frequency of the clock signal input to a charge pump affects the noise level and current supply capability of the charge pump.

A charge pump has to be able to supply the minimum required output voltage under load that is required by the system, given the minimum possible value of Vio (and thus of Vdd_int, and thus finally to the charge pump supply input, Vcp_in). For example, if the desired output from the positive charge pump 214a is +3.4V, and the minimum Vio is +1.6V, the positive charge pump 214a must be able to at least more than double the input voltage Vio.

The positive charge pump 214a is coupled to a set of fly caps 216a (shown as N in this example) as energy transfer devices. The number N for the set of fly caps 216a is determined based on the design criteria for a particular charge pump circuit and application, as is known in the art.

The voltage output of the positive charge pump 214a is typically applied to a suitable filter circuit 218a to provide a reasonably smooth output voltage, Vdd. For example, the filter circuit 218a may be implemented as a combination of one or more resistors, capacitors, and inductors. Note also that while the feedback circuit 220a is preferably coupled after the filter circuit 218a, in some implementations the feedback circuit 220a may be coupled before the filter circuit 218a.

The positive charge pump 214a is coupled to the clock source 206, which provides a clock signal 206a to the positive charge pump 214a. As noted above, the frequency of the clock signal affects the noise level and current supply capability of the positive charge pump 214a.

Note that while the positive charge pump regulator 208a is shown as coupled before the positive charge pump 214a, it may instead be coupled after the positive charge pump 214a (i.e., pre-regulation versus post-regulation). It addition, it is possible to implement the design without any charge pump regulator, and essentially control the output voltage (drive capability) of the positive charge pump 214a by the clock signal frequency alone, assuming there is some form of load. It may be useful to retain some form of differential or operational amplifier to drive the bias signal generator 204, thus in essence just deleting the power FET 212a.

In the illustrated embodiment of the present invention, the input Vdd_Sense to the differential amplifier 210a essentially follows, or monitors, the output Vdd of the positive charge pump 214a. The output voltage Vdd will vary with load, tending to decrease as load increases. Accordingly, the output of the differential amplifier 210a essentially reflects the current draw, or load, on the positive charge pump 214a. By applying the output of the differential amplifier 210a to the bias signal generator 204, the bias signal to the clock source 206 varies with the monitored load at the output Vdd of the positive charge pump 214a, thus varying the clock signal to the positive charge pump 214a as a function of load. Accordingly, as the monitored load increases, Vdd begins to slump, Vdd_Sense decreases, the output of the differential amplifier 210a decreases, the bias signal from the bias signal generator 204 to the clock source 206 increases, the frequency of the clock signal increases, and the positive charge pump 214a increases its output current to supply the increased load. However, as the load decreases, this feedback loop causes the frequency of the clock signal to decrease, and the positive charge pump 214a decreases its output current in response to the decreased load, resulting in significantly less noise from the positive charge pump 214a.

It should be appreciated that while the illustrated embodiment uses the output of the differential amplifier 210a as a way of providing feedback to the bias signal generator 204, other ways of accomplishing the same function will be readily apparent to one of ordinary skill in the art. For example, the feedback circuit 220a may be implemented to sense voltage changes or current indicative of the current load at the output of the positive charge pump 214a, and directly provide a control signal to the bias signal generator 204 for altering the bias signal to the clock source 206 and hence changing the frequency of the clock signal to adjust to changes in the current load.

FIG. 2 also shows a negative charge pump regulator 208b, a feedback circuit 220b, and associated charge pump circuitry 214b-218b. Each of the positive charge pump regulator 208a and the negative charge pump regulator 208b and their associated circuitry shown in FIG. 2 operate in similar fashion, differing principally in the sign (polarity) of their respective output voltages. Accordingly, the description above of the positive charge pump regulator 208a, feedback circuit 220a, and associated charge pump circuitry 214a-218a applies to the negative charge pump regulator 208b, feedback circuit 220b, and associated charge pump circuitry 214b-218b, with the appropriate polarity differences and a suitable reference voltage Vr2 for the negative charge pump regulator 208b. One structural difference in implementing the negative charge pump 214b is that the number of fly capacitors 216b (shown as M in this example) is typically greater than for the positive charge pump 214a (shown as N in this example) to achieve the same output voltage level (with polarity reversed), in order to offset the initial positive voltage input Vdd_int. It should also be noted that only one of the two charge pump circuit sections need be present, for downstream circuits that only require an increased positive voltage supply or a negative voltage supply.

Note that in FIG. 2, additional filtering capacitors, typically present on each input and output supply, are omitted to avoid confusion with the energy transfer fly capacitors 216a, 216b. In addition, while one bias signal generator 204 and clock source 206 is shown coupled to both the positive charge pump 214a and the negative charge pump 214b, instead separate bias signal generators and clock sources can be coupled to each charge pump so that the frequency of the clock signal to each charge pump is independently determined by the load on such charge pump.

A further aspect of the invention is to add some randomization to the frequency of the clock signal to the charge pump(s) in order to spread generated output spur signals (spurs). A fixed clock frequency leads to a fixed tone or spur that is coupled into the RF path. If one were to quantify the spurious free dynamic range (SFDR), a fixed frequency (tone) has a higher peak than a variable frequency clock. The variable frequency has its power distributed across a range of frequencies, thus reducing the peak power that might be coupled into the RF path. Referring to FIG. 2, an optional noise source 230 may be added to the bias signal of the clock source 206 to add some variability to the frequency of the clock signal. The amount of bias signal variation would depend on the specifics of a particular system design, and depends, among other things, on how much frequency spreading is required for a specified SFDR and how bad spurious coupling happens to be for a particular product or application.

It will be appreciated that the circuits described above may be implemented with a variety of circuit parameters, including but not limited to voltage values, and that one of ordinary skill in the art would select such parameters based on a particular application and implementation technology. As one example, the various voltage regulators 202, 208a, 208b do not have to be an LDO type, but may be any other desired type that meets a particular implementation specification and technology, such as a depletion mode source follower output or the like.

Accordingly, aspects of the invention include monitoring the voltage output or current load of a frequency driven charge pump circuit, and dynamically adjusting the input frequency of the charge pump circuit in response to changes to the voltage output or current load. Doing so avoids generating excessive noise from the charge pump circuit, thereby reducing charge pump noise injection into source supplies, output supplies, and related circuits. Thus, the charge pump circuit is only noisy when it has to be while providing optimal power when required and being electrically quiet and operating at lower power at all other times.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A variable frequency charge pump circuit, including:
   (a) at least one charge pump having a clock signal input, a voltage supply input, and an output, each for providing a pumped output voltage at the corresponding output based on a regulated input voltage applied at the corresponding voltage supply input, with a current available at the corresponding output as a function of the frequency of a signal applied to the corresponding clock signal input;
   (b) at least one feedback circuit, each coupled to the output of a corresponding charge pump, each feedback circuit for providing a feedback signal indicative of the pumped output voltage at such output; and
   (c) at least one charge pump regulator and variable frequency clock circuit, each coupled to a voltage source, the voltage supply input and the clock signal input of a corresponding charge pump, and the feedback signal of the feedback circuit corresponding to such charge pump, each charge pump regulator and variable frequency clock circuit for generating an output control signal as a function of the feedback signal, and providing the output control signal to (1) charge pump regulator circuitry for generating and providing the regulated input voltage to the voltage supply input of the corresponding charge pump to regulate the pumped output voltage at the output of the corresponding charge pump, and (2) variable-frequency clock circuitry for generating and providing a continuously variable-frequency clock signal to the clock signal input of the corresponding charge pump to control the amount of current available at the output of the corresponding charge pump;
   wherein, for each one of the at least one charge pumps, as a load at the output of such one charge pump increases, the frequency of the provided continuously variable-frequency clock signal increases and the current available at the output of such one charge pump increases, and as the load decreases, the frequency of the provided continuously variable-frequency clock signal decreases and the current available from such one charge pump decreases.

2. The variable frequency charge pump circuit of claim 1, wherein at least one of the at least one charge pump regulator and variable frequency clock circuits is coupled to the voltage supply input and the clock signal input of a corresponding positive charge pump, and at least one of the at least one charge pump regulator and variable frequency clock circuits is coupled to the voltage supply input and the clock signal input of a corresponding negative charge pump.

3. The variable frequency charge pump circuit of claim 1, wherein at least one of the at least one charge pump regulator and variable frequency clock circuits includes a low-dropout regulator.

4. The variable frequency charge pump circuit of claim 1, wherein at least one of the at least one charge pump regulator and variable frequency clock circuits is coupled to the voltage supply input and the clock signal input of a corresponding positive charge pump.

5. The variable frequency charge pump circuit of claim 1, wherein at least one of the at least one charge pump regulator and variable frequency clock circuits is coupled to the voltage supply input and the clock signal input of a corresponding negative charge pump.

6. A method for controlling a charge pump circuit, including:
   (a) providing at least one charge pump having a clock signal input, a voltage supply input, and an output, each for providing a pumped output voltage at the corresponding output based on an input voltage applied at the corresponding voltage supply input, with a current available at the corresponding output as a function of the frequency of a signal applied to the corresponding clock signal input; and (b) for each charge pump,
  (1) generating a corresponding feedback signal indicative of the pumped output voltage at the output of such charge pump;
  (2) generating an output control signal as a function of the corresponding feedback signal;
  (3) generating a regulated input voltage as a function of the output control signal and providing the regulated input voltage to the voltage supply input of such charge pump to regulate the pumped output voltage at the output of such charge pump;
  (3) generating a continuously variable-frequency clock signal as a function of the output control signal and providing the continuously variable-frequency clock signal to the clock signal input of such charge pump to control the amount of current at the output of such charge pump;
  (4) increasing the frequency of the provided continuously variable-frequency clock signal as a load at the output of such charge pump increases, thereby increasing the current available at the output of such charge pump; and
  (5) decreasing the frequency of the provided continuously variable-frequency clock signal as the load decreases.

7. The method of claim 6, wherein at least one charge pump is a positive charge pump.

8. The method of claim 6, wherein at least one charge pump is a negative charge pump.

\* \* \* \* \*